(12) United States Patent
Aparin et al.

(10) Patent No.: US 8,694,452 B2
(45) Date of Patent: Apr. 8, 2014

(54) METHODS AND SYSTEMS FOR CMOS IMPLEMENTATION OF NEURON SYNAPSE

(75) Inventors: Vladimir Aparin, San Diego, CA (US); Jeffrey A. Levin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 715 days.

(21) Appl. No.: 12/831,675

(22) Filed: Jul. 7, 2010

(65) Prior Publication Data

US 2012/0011091 A1 Jan. 12, 2012

(51) Int. Cl.
*G06G 7/00* (2006.01)
*G06N 3/00* (2006.01)

(52) U.S. Cl.
USPC .......................................................... 706/38

(58) Field of Classification Search
USPC .................................... 706/25, 26, 35, 38, 39
See application file for complete search history.

(56) References Cited

U.S. PATENT DOCUMENTS

| 4,174,639 | A  | * | 11/1979 | Raven ............................... | 73/766 |
| 5,148,514 | A  | * | 9/1992  | Arima et al. .................... | 706/34 |
| 5,371,835 | A  | * | 12/1994 | Akamatsu et al. .............. | 706/26 |
| 5,818,081 | A  | * | 10/1998 | Ohmi et al. ...................... | 706/26 |
| 2010/0109656 | A1 | * | 5/2010  | Wang et al. .................... | 324/210 |
| 2011/0004579 | A1 | * | 1/2011  | Snider ............................. | 706/25 |
| 2011/0182107 | A1 | * | 7/2011  | Wu et al. ......................... | 365/148 |
| 2011/0240941 | A1 | * | 10/2011 | Pickett et al. .................... | 257/1 |
| 2012/0014169 | A1 | * | 1/2012  | Snider ............................. | 365/148 |
| 2012/0127780 | A1 | * | 5/2012  | Strachan et al. ................ | 365/148 |

FOREIGN PATENT DOCUMENTS

SU           623214 A1      9/1978

OTHER PUBLICATIONS

Afifi, A., et al. "Implementation of biologically plausible spiking neural network models on the memristor crossbar-based CMOS/nano circuits." European Conference on Circuit Theory and Design, 2009. ECCTD 2009. IEEE, Aug. 23-27, 2009. pp. 563-566.*
Kim, H. et al. "Neural synaptic weighting with a pulse-based memristor circuit." Circuits and Systems I: Regular Papers, IEEE Transactions on. vol. 59 No. 1. Jan. 2012. pp. 148-158.*
Jo, S.H. "Nanoscale memristive devices for memory and logic applications." PhD diss., The University of Michigan, 2010. Available Jun. 3, 2010. 158 pages. http://hdl.handle.net/2027.42/75835.*
Pérez-Carrasco, J. A., et al. "On neuromorphic spiking architectures for asynchronous STDP memristive systems." Proceedings of 2010 IEEE International Symposium on Circuits and Systems (ISCAS). IEEE, May 30, 2010-Jun. 2, 2010. pp. 1659-1662.*
Chua, L.O. et al. "Autonomous Cellular Neural Networks: A Unified Paradigm for Pattern Formation and Active Wave Propagation." IEEE Transactions on Circuits and Systems-I: Fundamental Theory and Applications, vol. 42, No. 10, Oct. 1995. pp. 559-577.*
Maxim Integrated. "Resistive Bridge Basics: Part One", Tutorial 3426. Dec. 22, 2004. 10 pages.*
Maxim Integrated. "Resistive Bridge Basics: Part Two", Tutorial 3545. Jun. 20, 2005. 9 pages.*

(Continued)

*Primary Examiner* — Jeffrey A Gaffin
*Assistant Examiner* — Benjamin Buss
(74) *Attorney, Agent, or Firm* — Rupit M. Patel

(57) ABSTRACT

Certain embodiments of the present disclosure support techniques for power efficient implementation of neuron synapses with positive and/or negative synaptic weights.

21 Claims, 17 Drawing Sheets

(a)

(b)

(56) References Cited

OTHER PUBLICATIONS

J. Schemmel, K. Meier and E. Mueller, "A New VLSI Model of Neural Microcircuits Including Spike Time Dependent Plasticity", Proceedings of IEEE International Joint Conference on Neural Networks, vol. 3, pp. 1711-1716, 2004.

L.O. Chua, "Memristor-the missing circuit element", IEEE Trans. Circuit Theory, 1971, vol. CT-18,No. 5,p. 507-519.

Strukov,D.B., Snider, G.S.,Stwart,D.R.,Williams,R.S. The missing memristor found.Nature,vol. 453, May 1, 2008, pp. 80-83.

Greg S. Snider, Spike-timing-dependent learning in memristive nanodevices. 2008 IEEE/ACM International Symposium on Nanoscale Architectures, pp. 85-92, Jun. 2008.

A. Afifi, A. Ayatollahi and F. Raissi, STDP implementation using memristive nanodevice in CMOS-Nano neuromorphic networks. IEICE electronics Express, vol. 6,No. 3, pp. 148-153. Feb. 2009.

International Search Report and Written Opinion—PCT/US2011/043251—ISA/EPO—Nov. 17, 2011.

He M et al., "Architecture of neural synaptic array, design and simulation", 7th IEEE Conference on Nanotechnology, 2007: IEEE-Nano 2007; Hong Kong, China, Aug. 2-5, 2007, Piscataway, NJ: IEEE Service Center, Piscataway, NJ, USA, Aug. 2, 2007, pp. 601-604, XP031307847, ISBN: 978-1-4244-0607-4.

Kothari R. et al., "On the realization of a Q-state neuron", Neural Networks, 1994. IEEE World Congress on Computational Intelligence., 1994 IEEE International Conference on Orlando, FL, USA Jun. 27-Jul. 2, 1994, NewYork, NY, USA, IEEE, vol. 4, Jun. 27, 1994, pp. 2089-2092, XP010127625, DOI: 10.1109/ICNN.1994.374536 ISBN: 978-0-7803-1901-1 pp. 2089-2091.

Linares-Barranco B., et al., "Memristance can explain Spike-Time-Dependent-Plasticity in Neural Synapses", Nature Precedings, Nature Publishing Group, GB, Jan. 1, 2009, pp. 1-4, XP002590149, ISSN: 1756-0357, DOI: 10101/NPRE.2009.3010.1 [retrieved on Mar. 31, 2009].

Sung Hyun Jo et al., "Si Memristive devices applied to memory and neuromorphic circuits", IEEE International Symposium on Circuits and Systems. ISCAS 2010—May 30-Jun. 2, 2010—Paris, France, IEEE, US May 30, 2010, pp. 13-16, XP031724382, ISBN: 978-1-4244-5308-5 pp. 13-16.

\* cited by examiner

METHODS AND SYSTEMS FOR CMOS IMPLEMENTATION OF NEURON SYNAPSE

BACKGROUND

1. Field

Certain embodiments of the present disclosure generally relate to neural system engineering and, more particularly, to a method for power efficient implementation of neuron synapses with positive and/or negative weights.

2. Background

Neural system engineering has been attracting significant attention in recent years. Inspired by a biological brain with excellent flexibility and power efficiency, neural systems can be employed in many applications such as pattern recognition, machine learning and motor control. One of the biggest challenges of a practical neural system implementation is hardware density. Neurons and synapses are the two fundamental components of a neural system whose quantity can be as high as billions. As an example, a human brain has approximately $10^{11}$ neurons.

As a result, in order to implement practical neural systems, the neuron hardware is required to be extremely area efficient. In existing analog neuron implementations, area efficiency is limited by an integrating capacitor that mimics the neuron membrane capacitance. In order to design neurons operating with a time constant close to that of biological systems (e.g., approximately 1 ms), hundreds of fF capacitance is required even with minimal integrating current. Therefore, an area consumed by a single neuron can be quite large, especially with low-density on-chip capacitors (e.g., with densities of 2 to 11 $fF/\mu m^2$).

Very Large Scale Integration (VLSI) implementation of brain computing devices also suffer from high power consumption due to a large number of neurons and even larger number of synaptic connections between the neurons. Technology scaling has allowed implementation of approximately one million neurons per chip. Each neuron can be connected to at least 1000 other neurons, which brings the number of synapses per chip to approximately one billion. In order to keep the power consumption low, each synapse should consume less than 100 nW. This is very challenging requirement and creates technology obstacle for VLSI implementation of brain computing devices.

A synaptic current that determines the strength of connection between neuron circuits is typically generated in the art by applying a fixed voltage across a variable resistor. However, this approach can lead to high power consumption, and only one type of the synaptic connection (excitatory or inhibitory) can be implemented.

SUMMARY

Certain embodiments of the present disclosure provide a synaptic electrical circuit for connection between a pre-synaptic neuron circuit and a post-synaptic neuron circuit. The electrical circuit generally includes a source of a constant electrical current, and a resistive divider to scale the constant electrical current to generate an output electrical current that determines a connection between the pre-synaptic neuron circuit and the post-synaptic neuron circuit.

Certain embodiments of the present disclosure provide a method for controlling a synaptic connection between a pre-synaptic neuron circuit and a post-synaptic neuron circuit. The method generally includes providing a source of a constant electrical current, and scaling the constant electrical current with a resistive divider to generate an output electrical current that determines the connection between the pre-synaptic neuron circuit and the post-synaptic neuron circuit.

Certain embodiments of the present disclosure provide an apparatus for controlling a synaptic connection between a pre-synaptic neuron circuit and a post-synaptic neuron circuit. The apparatus generally includes means for providing a source of a constant electrical current, and means for scaling the constant electrical current with a resistive divider to generate an output electrical current that determines the connection between the pre-synaptic neuron circuit and the post-synaptic neuron circuit.

BRIEF DESCRIPTION OF THE DRAWINGS

So that the manner in which the above-recited features of the present disclosure can be understood in detail, a more particular description, briefly summarized above, may be had by reference to embodiments, some of which are illustrated in the appended drawings. It is to be noted, however, that the appended drawings illustrate only certain typical embodiments of this disclosure and are therefore not to be considered limiting of its scope, for the description may admit to other equally effective embodiments.

DETAILED DESCRIPTION

Various embodiments of the disclosure are described more fully hereinafter with reference to the accompanying drawings. This disclosure may, however, be embodied in many different forms and should not be construed as limited to any specific structure or function presented throughout this disclosure. Rather, these embodiments are provided so that this disclosure will be thorough and complete, and will fully convey the scope of the disclosure to those skilled in the art. Based on the teachings herein one skilled in the art should appreciate that the scope of the disclosure is intended to cover any embodiment of the disclosure disclosed herein, whether implemented independently of or combined with any other embodiment of the disclosure. For example, an apparatus may be implemented or a method may be practiced using any number of the embodiments set forth herein. In addition, the scope of the disclosure is intended to cover such an apparatus or method which is practiced using other structure, functionality, or structure and functionality in addition to or other than the various embodiments of the disclosure set forth herein. It should be understood that any embodiment of the disclosure disclosed herein may be embodied by one or more elements of a claim.

The word "exemplary" is used herein to mean "serving as an example, instance, or illustration." Any embodiment described herein as "exemplary" is not necessarily to be construed as preferred or advantageous over other embodiments.

Although particular embodiments are described herein, many variations and permutations of these embodiments fall within the scope of the disclosure. Although some benefits and advantages of the preferred embodiments are mentioned, the scope of the disclosure is not intended to be limited to particular benefits, uses or objectives. Rather, embodiments of the disclosure are intended to be broadly applicable to different technologies, system configurations, networks and protocols, some of which are illustrated by way of example in the figures and in the following description of the preferred embodiments. The detailed description and drawings are merely illustrative of the disclosure rather than limiting, the scope of the disclosure being defined by the appended claims and equivalents thereof.

Exemplary Neural System

Figure 1:
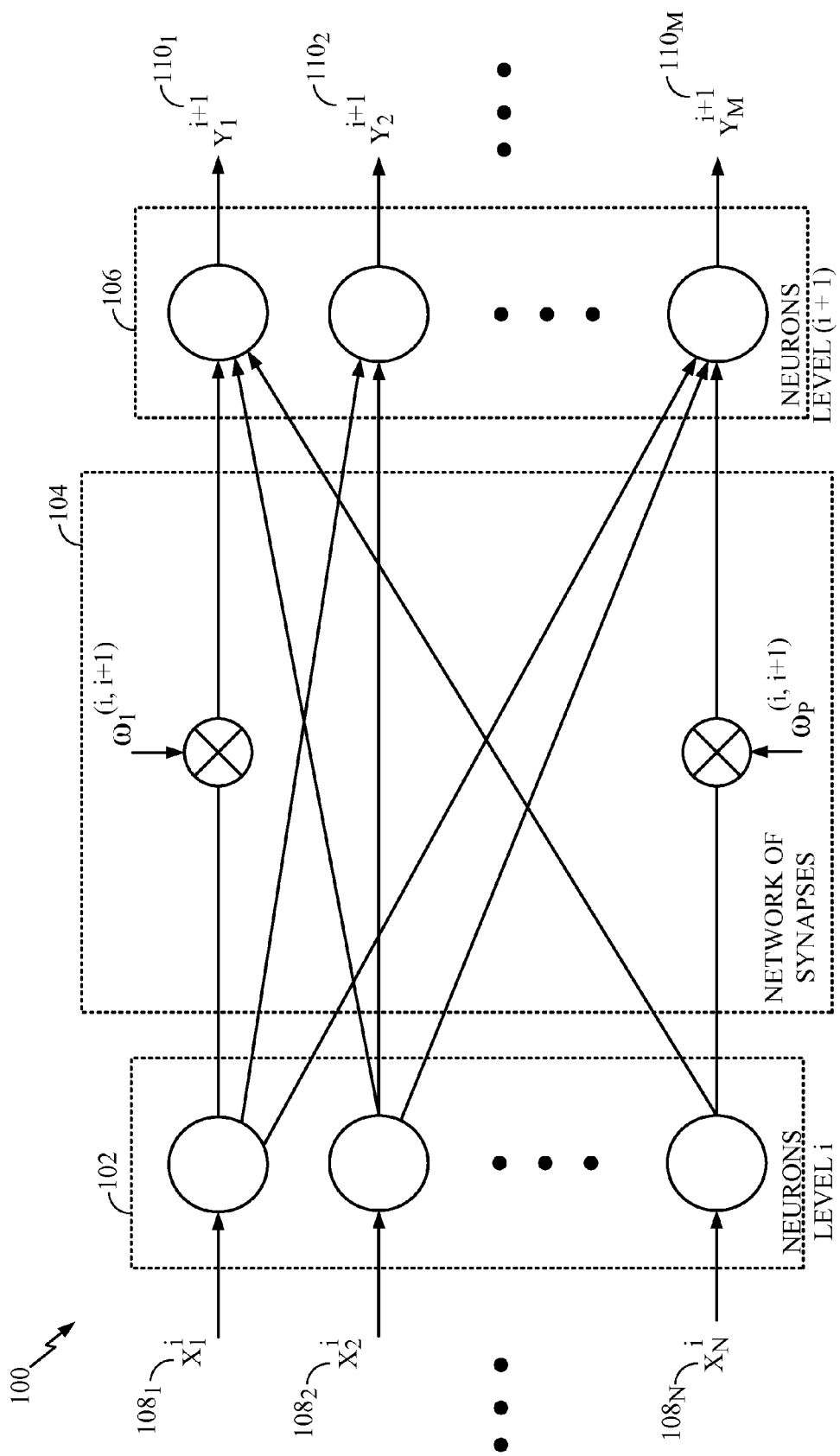
FIG. 1 illustrates an example neural system in accordance with certain embodiments of the present disclosure.

FIG. 1 illustrates an example neural system 100 with multiple levels of neurons in accordance with certain embodiments of the present disclosure. The neural system 100 may comprise a level of neurons 102 connected to another level of neurons 106 though a network of synapse connections 104. For simplicity, only two levels of neurons are illustrated in FIG. 1, although much more levels of neurons may exist in a typical neural system.

As illustrated in FIG. 1, each neuron in the level 102 may receive an input signal 108 that may be generated by a plurality of neurons of a previous level (not shown in FIG. 1). The signal 108 may represent an input current of the level 102 neuron. This current may be accumulated on the neuron membrane to charge a membrane potential. When the membrane potential reaches its threshold value, the neuron may fire and output a spike to be transferred to the next level of neurons (e.g., the level 106).

The transfer of spikes from one level of neurons to another may be achieved through the network of synaptic connections (or simply "synapses") 104, as illustrated in FIG. 1. The synapses 104 may receive output signals (i.e., spikes) from the level 102 neurons, scale those signals according to adjustable synaptic weights (where P is a total number of synaptic connections between the neurons of levels 102 and 106), and combine the scaled signals as an input signal of each neuron in the level 106. Every neuron in the level 106 may generate output spikes 110 based on the corresponding combined input signal. The output spikes 110 may be then transferred to another level of neurons using another network of synaptic connections (not shown in FIG. 1).

The neural system 100 may be emulated by an electrical circuit and utilized in a large range of applications, such as pattern recognition, machine learning and motor control. Each neuron in the neural system 100 may be implemented as a neuron circuit. The neuron membrane charged to the threshold value initiating the output spike may be implemented as a capacitor which integrates an electrical current that flows through it.

Certain embodiments of the present disclosure may eliminate the capacitor as the electrical current integrating device and use a memristor element in its place. This approach may be applied in neuron circuits, as well as in various other applications where bulky capacitors are utilized as electrical current integrators. With nanometer feature-sized memristors, the area of neuron circuit may be substantially reduced, which may make implementation of a very large-scale neural system hardware implementation practical.

An electrical current through each synapse of the network of synapses 104 may be limited by an associated input current source $I_0$. The synaptic current may be generated, for example, by steering the current $I_0$ using a resistive (or memristive) bridge. The resistive bridge may allow steering the source current $I_0$ into and out of a neuron input, thus creating both excitatory and inhibitory synaptic connections between neurons.

Certain embodiments of the present disclosure support a low power implementation of neuron synapses (e.g., with a power consumption less that 1.2 nW per synapse during an output spike), easy control of the synaptic weight by the resistive (memristive) bridge, and implementation of both positive and negative synaptic weights (i.e., a common design for both excitatory and inhibitory synaptic connections).

Exemplary Power-Efficient Implementation of Neuron Synapses

Figure 2:
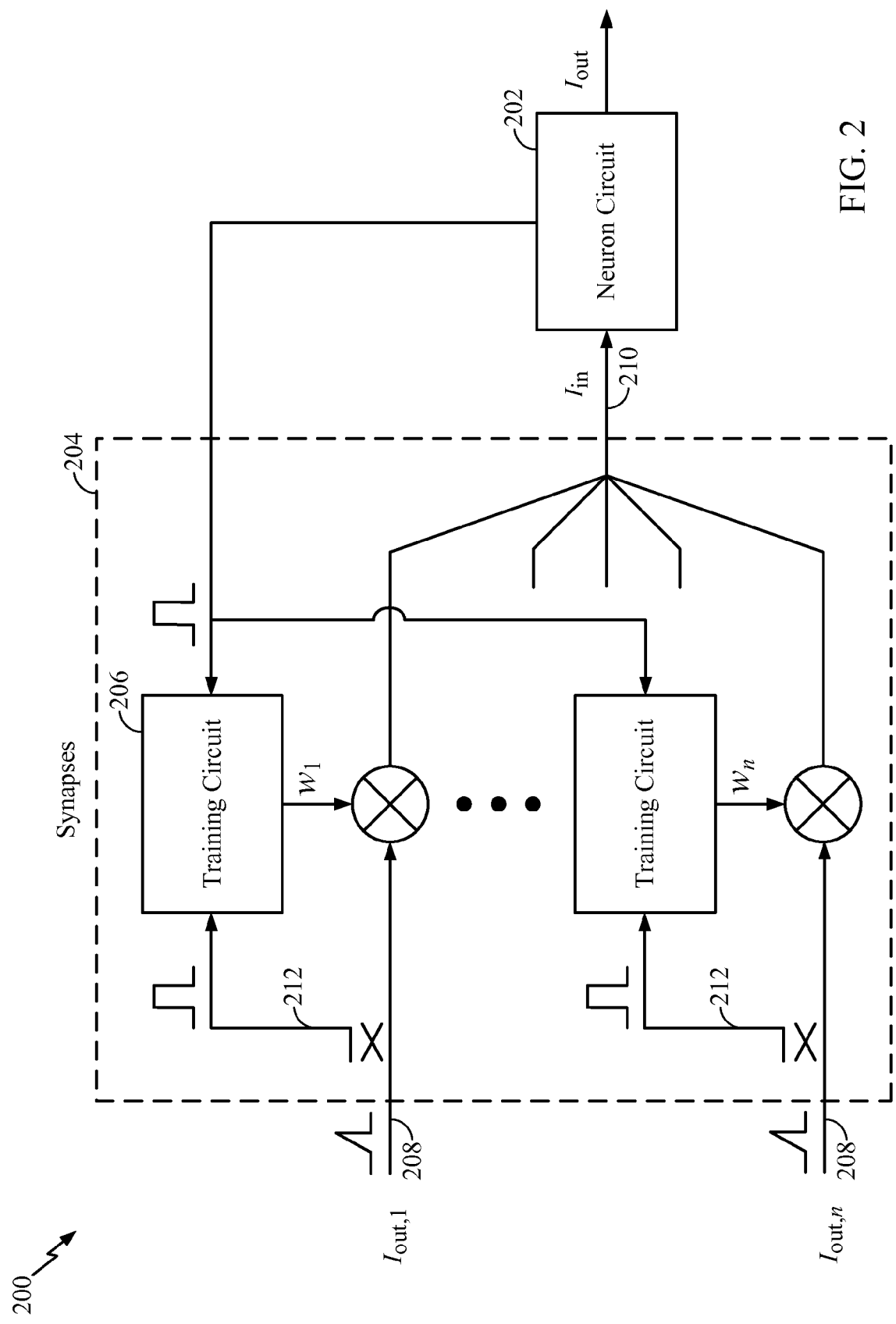
FIG. 2 illustrates an example neuron circuit and its synapses with weight-training circuits in accordance with certain embodiments of the present disclosure.

FIG. 2 illustrates an example conceptual block diagram 200 of a neuron circuit 202, its synapses 204 with weight-training circuits 206 in accordance with certain embodiments of the present disclosure. The synapse circuitry 204 may correspond to a portion of the synaptic network 104 from FIG. 1, and the neuron circuit 202 may be, for example, one of the post-synaptic neurons of the level 106. The synapse circuitry 204 may provide following operations: reception of output (axonal) currents 208 from a plurality of neurons in the previous level, scaling of those currents according to synaptic weights $w_1, \ldots, w_n$, combining the scaled currents as an input current 210 of the neuron circuit 202, and generation of a control signal 212 for each synaptic connection, which may indicate a presence of a spike in that connection.

Figure 3:
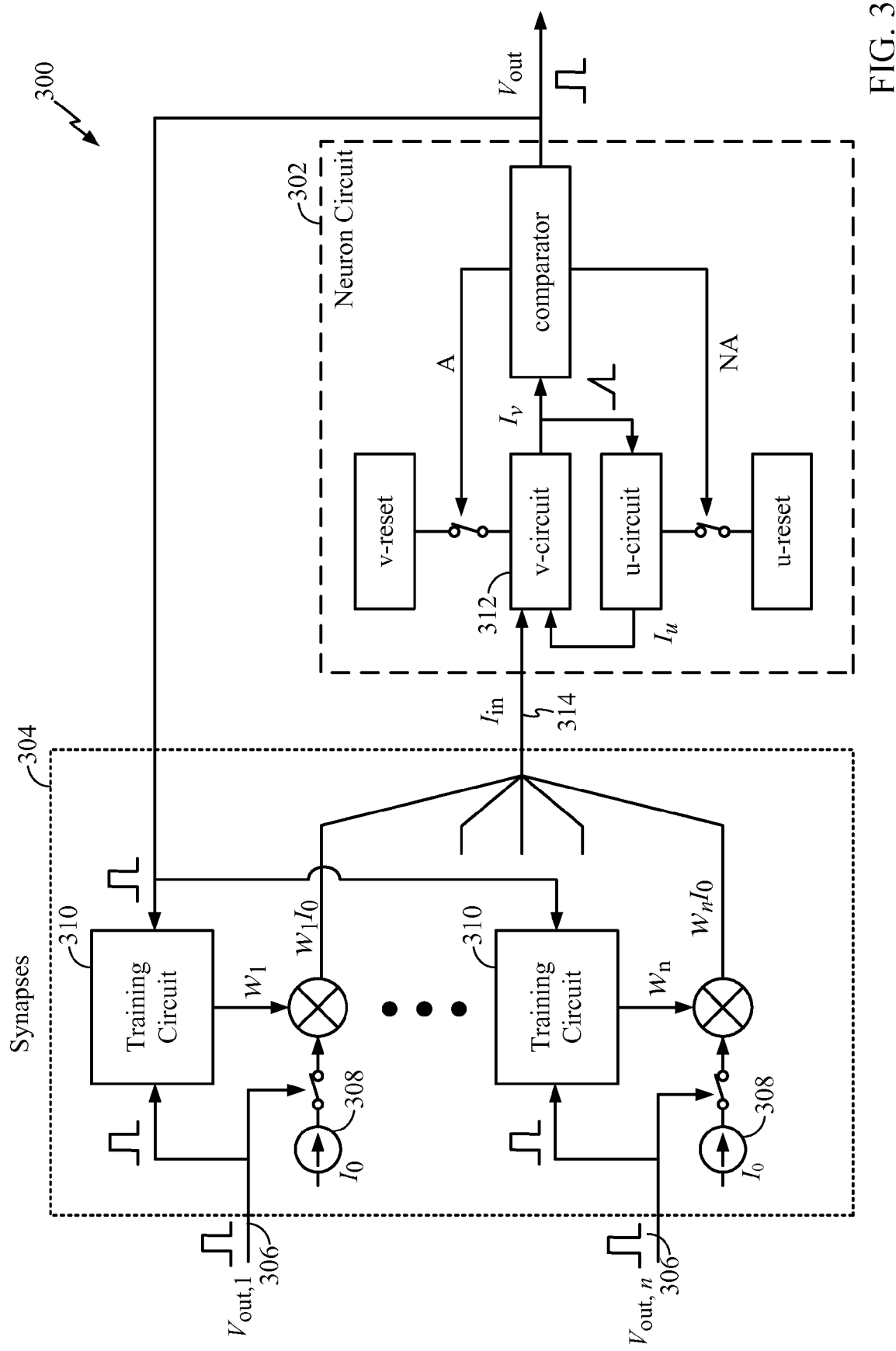
FIG. 3 illustrates an example neuron circuit and its synapses with control voltage interface in accordance with certain embodiments of the present disclosure.

Sending and receiving the small axonal current to/from the synapse circuitry 204 and then generating the control signal from it may present technical difficulties. FIG. 3 illustrates an example conceptual block diagram 300 of a neuron circuit 302 and its synapses 304 with control voltage interface signals 306 in accordance with certain embodiments of the present disclosure. Sending and receiving the control voltage signals generated by neuron circuits may represent more efficient solution than sending/receiving electrical currents as illustrated in FIG. 2.

The logic high levels ("1s") of the control voltage signal 306 may be aligned with electrical current spikes of a neuron associated with this control signal. The control signal 306 may gate a constant electrical current 308 into a corresponding synaptic connection of a post-synaptic neuron and control a weight-training circuit 310, as conceptually illustrated in FIG. 3.

Figure 4:
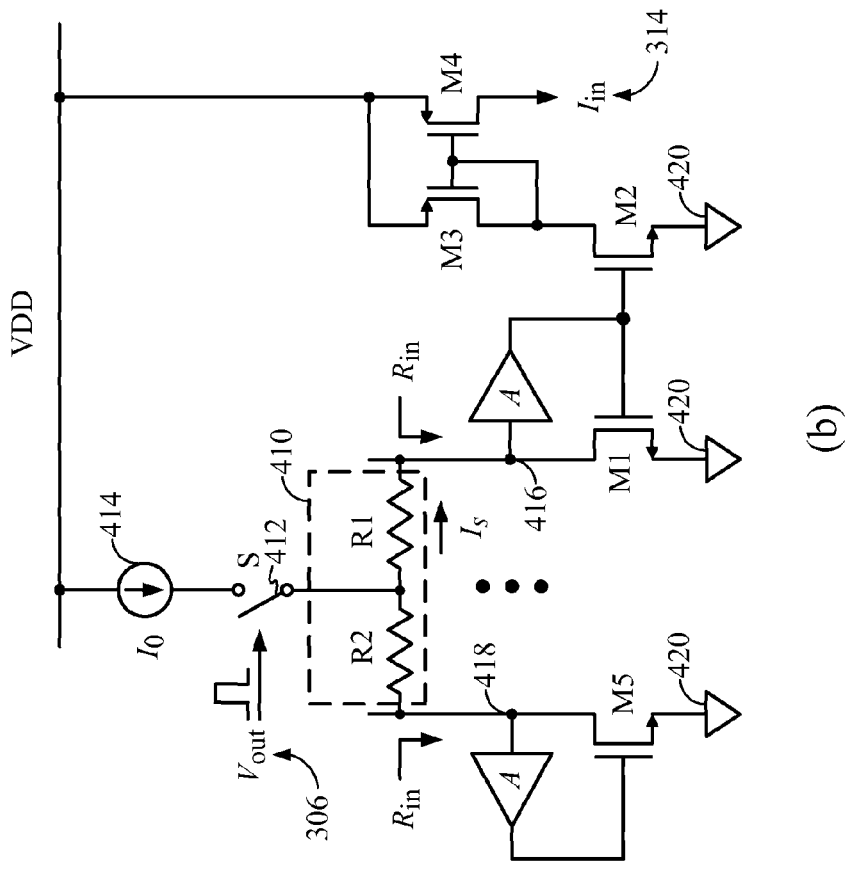
FIG. 4 illustrates example implementations of a synapse in accordance with certain embodiments of the present disclosure.
Figure 4:
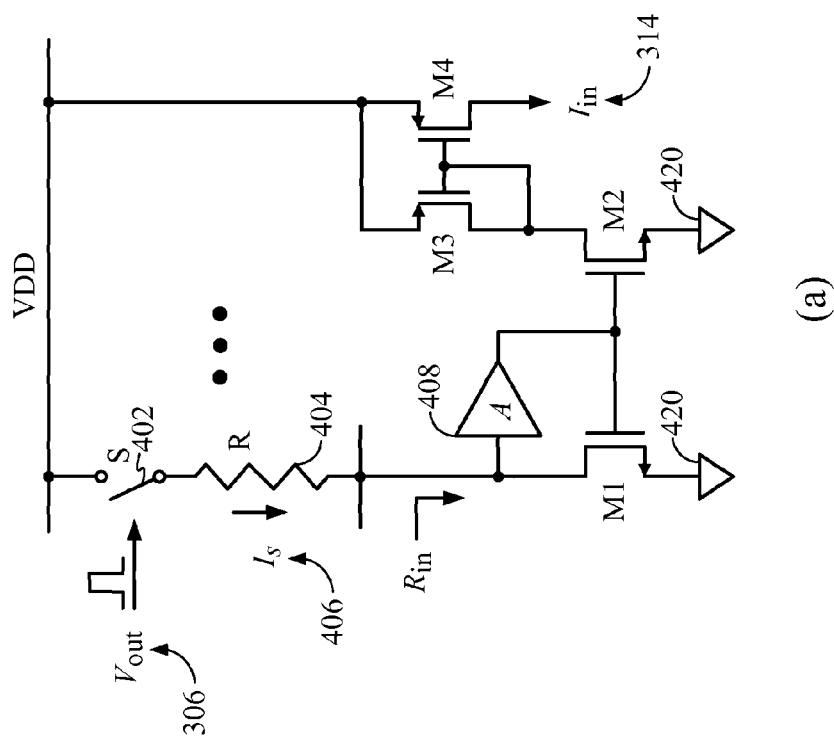

Examples of possible complementary metal-oxide-semiconductor (CMOS) implementations of synapses are illustrated in FIG. 4. One way to generate and scale a synaptic current may be to apply a fixed voltage across a variable resistor (i.e., a memristor), as illustrated in FIG. 4A. Each synapse may be represented by a switch 402 and a memristor element 404 connected in series between a supply voltage $V_{DD}$ and a current combiner M1. Each synaptic current 406 may be given by:

$$I_s = \frac{V_{DD} - V_{D1}}{R + R_{in}}, \quad (1)$$

where $V_{D1}$ is a drain voltage of the current combiner M1, R is a resistance of the memristor 404, and $R_{in}$ is an input resistance of the current combiner M1. If $V_{D1}$ does not change substantially during spiking as a function of different values of the memristor resistance R between $R_{min}$ and $R_{max}$, then the tuning range of synaptic current 406 may be defined as:

$$\frac{I_{s,max}}{I_{s,min}} = \frac{R_{max} + R_{in}}{R_{min} + R_{in}}, \quad (2)$$

The main drawback of the synaptic current generator illustrated in FIG. 4A is that it may produce an electrical current much higher than that used by an integrating v-circuit 312 of the neuron 302 from FIG. 3. A typical memristor resistance may be varied between 3 MΩ and 30 MΩ, i.e. $R_{min}$=3 MΩ and $R_{max}$=30 MΩ. If $R_{in}$=0, $V_{DD}$=1 V, and $V_{D1}$=0.4 V, then the synaptic current 406 may vary between 20 nA and 200 nA per spike, depending on a synapse weight. An input current 314 of the neuron circuit 302 (see FIG. 3) may be required to be less than 100 pA. However, it is impractical to build a 2000:1 current mirror or a current steering switch to attenuate the synaptic current.

Another drawback of the synapse illustrated in FIG. 4A is that its current combiner M1 may require a large current to obtain $R_{in}<<R_{min}$ for achieving 10:1 tuning range of the synaptic current $I_s$. Applying a feedback amplifier 408 with a gain value A may reduce $R_{in}$ by A times such that $R_{in} \approx 1/(g_{m1} \cdot A)$, where $g_{m1}$ is a transconductance of the current combiner M1. However, a typical value of the gain A for a single-stage amplifier may be approximately 20. Therefore, the transconductance $g_{m1}$ may be at least 200 nS, which may require a DC bias current of approximately 10 nA.

In order to reduce a peak spike current, the input current may be pre-defined to a fixed value $I_0$ of, for example, 100-200 pA, which may be attenuated by a resistive current divider 410, as illustrated in FIG. 4B. Each synapse may be represented by the current divider 410, a switch 412, and a current source 414 corresponding to the peak spike current $I_0$. As illustrated in FIG. 4B, the synaptic circuit may be connected between a power supply voltage $V_{DD}$ and inputs 416-418 of the current combiners M1 and M5. The transistor M5 may be of the same size and bias as the transistor M1, and it may be used to dump an unused portion of the current 414. A synaptic current $I_s$ illustrated in FIG. 4 may be given as:

$$I_s = I_0 \frac{R_2 + R_{in}}{R_1 + R_2 + 2R_{in}}. \quad (3)$$

The maximum tuning range of the synaptic current $I_s$ may be achieved when $R_1$ and $R_2$ are both memristors and tuned in opposite directions, i.e. when $R_1$=$R_{min}$, $R_2$=$R_{max}$, and vice versa. In this case, the tuning range of synaptic current $I_s$ may be the same as that of the synapse from FIG. 4A, and it may be given by equation (2). As before, the bias current of the transistor M1 (as well as the bias current of the transistor M5) may be at least 10 nA in order to obtain $R_{in}<<R_{min}$ for achieving 10:1 tuning range of the synaptic current.

Tuning both $R_1$ and $R_2$ in opposite directions may be very difficult to implement. In one embodiment of the present disclosure, only $R_1$ may be tuned, while $R_2$ may be fixed at a resistance $R_0$. Then, the $I_s$ tuning range may become:

$$\frac{I_{s,max}}{I_{s,min}} = \frac{R_{max} + R_0 + 2R_{in}}{R_{min} + R_0 + 2R_{in}}, \quad (4)$$

which may be somewhat smaller than the tuning range defined by equation (2).

Besides the limited tuning range of the synaptic current and the large DC bias current of the current combiner M1, the synapses illustrated in FIGS. 4A-4B can only be excitatory, i.e. an input current spike may cause a current $I_{in}$ (i.e., an input current of a post-synaptic neuron) to increase proportionally. In order to implement an inhibitory synaptic connection, the switch 402 and the memristor 404 in FIG. 4A or the switch 412 and the current source 414 in FIG. 4B may need to be connected between the input of the current combiner M1 and a ground 420. While such change may not be complicated for implementation, this solution would permanently set the type of the synaptic connection.

Figure 5:
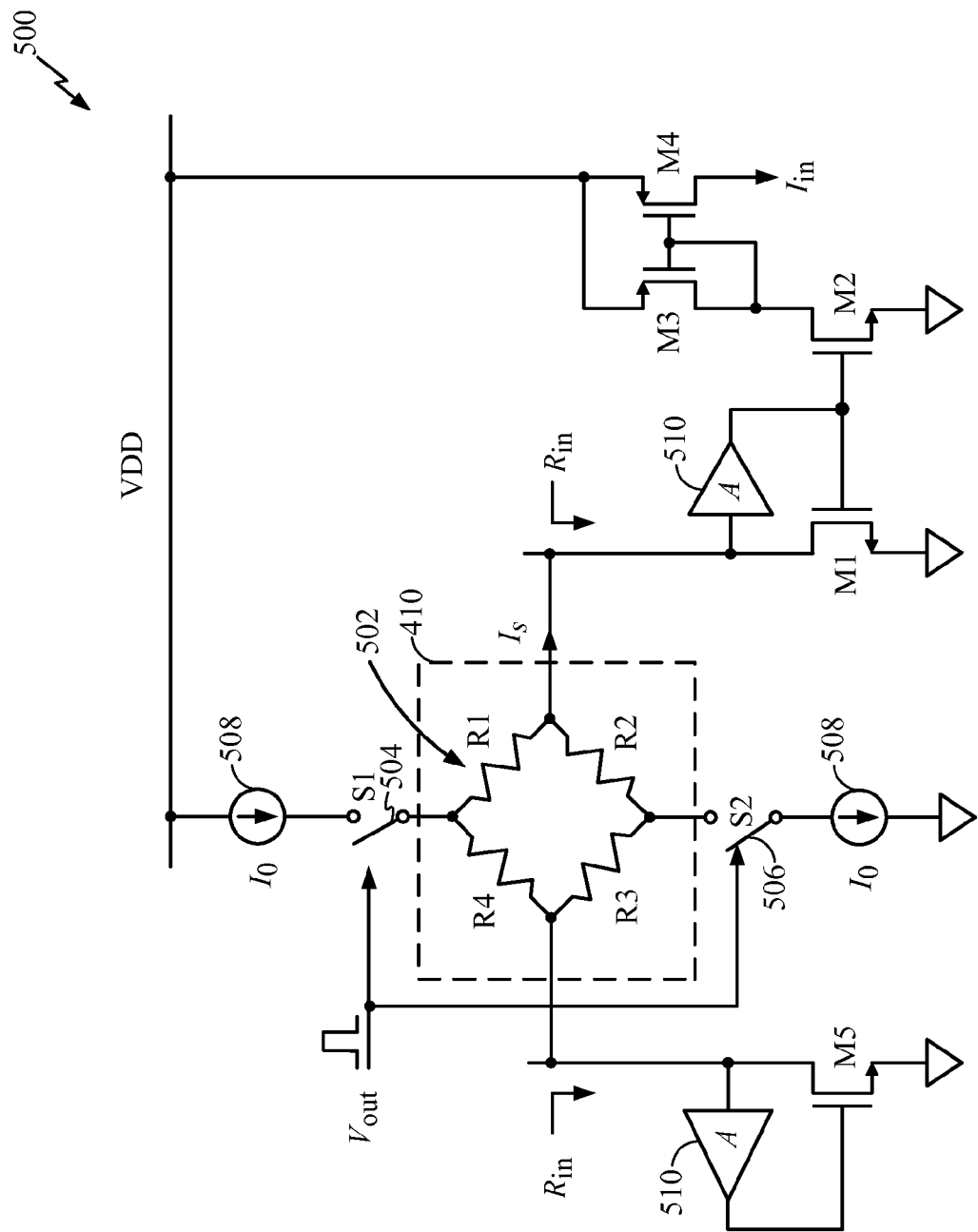
FIG. 5 illustrates an example of synapse based on a resistive bridge in accordance with certain embodiments of the present disclosure.

Certain embodiments of the present disclosure use the resistive current divider 410 based on a resistive bridge to implement a synaptic connection, as illustrated in FIG. 5. Each synapse may be represented by a resistive bridge 502, switches 504-506, and current sources 508. A synaptic current $I_s$ from FIG. 5 may be then determined as:

$$I_s = I_0 \frac{R_2 R_4 - R_1 R_3}{R_1 R_2 + R_1 R_3 + R_2 R_4 + R_3 R_4 + 2R_{in}(R_1 + R_2 + R_3 + R_4)}. \quad (5)$$

Since the electrical current entering the resistive bridge 502 at the top is equal to the electrical current leaving the bridge 502 at the bottom (i.e., both currents may be equal to $I_0$), the synaptic current $I_s$ may flow only between two current combiners M1 and M5.

In one embodiment of the present disclosure, only one out of four resistors of the resistive bridge 502 may be implemented as a memristor of variable resistance, while the remaining three resistors may be fixed. Let, for example, $R_4$ be a memristor of value R, while the resistors $R_1$-$R_3$ may be fixed at a resistance $R_0$. Then, the synaptic current $I_s$ from equation (5) may be now computed as:

$$I_s = \frac{I_0}{2} \frac{\frac{R}{R_0} - 1}{1 + \frac{R}{R_0} + \frac{R_{in}}{R_0}\left(3 + \frac{R}{R_0}\right)}. \quad (6)$$

If $R=R_0$, then the resistive bridge 502 may be perfectly balanced and no current flows between the combiners M1 and M5 (i.e., the synaptic current $I_s$=0). The synaptic connection may be disabled in this case. If $R>R_0$, then the resistive bridge 502 may be unbalanced such that a nonzero synaptic current $I_s$ flows from the M5 to the M1, and the input current $I_{in}$ of the post-synaptic neuron may increase. The synaptic connection may be excitatory in this case. If $R<R_0$, then the resistive bridge 502 may be unbalanced such that a nonzero synaptic current $I_s$ flows from the M1 to the M5, and the current $I_{in}$ may decrease. The synaptic connection may be inhibitory in this case.

Therefore, tuning only one memristor in the bridge 502 may switch the corresponding synaptic connection from disabled ($R=R_0$) to excitatory ($R>R_0$) or inhibitory ($R<R_0$), which may correspond to the synaptic weight values of zero, positive, and negative, respectively. Such synapse functionality may mimic the neural self-organization in the brain, when new synapses may be established and old inactive synaptic connections may be removed.

The value of resistance $R_0$ may be chosen such that the synaptic current $I_s$ may change from $-I_{s,max}$ to $+I_{s,max}$ when $R_4$ is tuned from $R_{min}$ to $R_{max}$. This value may be given by:

$$R_0 = 2\sqrt{\frac{R_{min}R_{max} + R_{in}(R_{min} + R_{max}) + 3R_{in}^2}{3}} \cos\left(\frac{\alpha}{3}\right) - R_{in}, \quad (7)$$

where $$\cos(\alpha) = -\frac{R_{in}^2(R_{min} + R_{max} + 2R_{in})}{2\sqrt{\left[\frac{R_{min}R_{max} + R_{in}(R_{min} + R_{max}) + 3R_{in}^2}{3}\right]^3}}. \quad (8)$$

For example, if $R_{min}$=3 MΩ, $R_{max}$=30 MΩ, and $R_{in}$=6 MΩ, then $R_0 \approx 11.4$ MΩ and $I_{s,max} \approx 0.124 I_0$.

Figure 6:
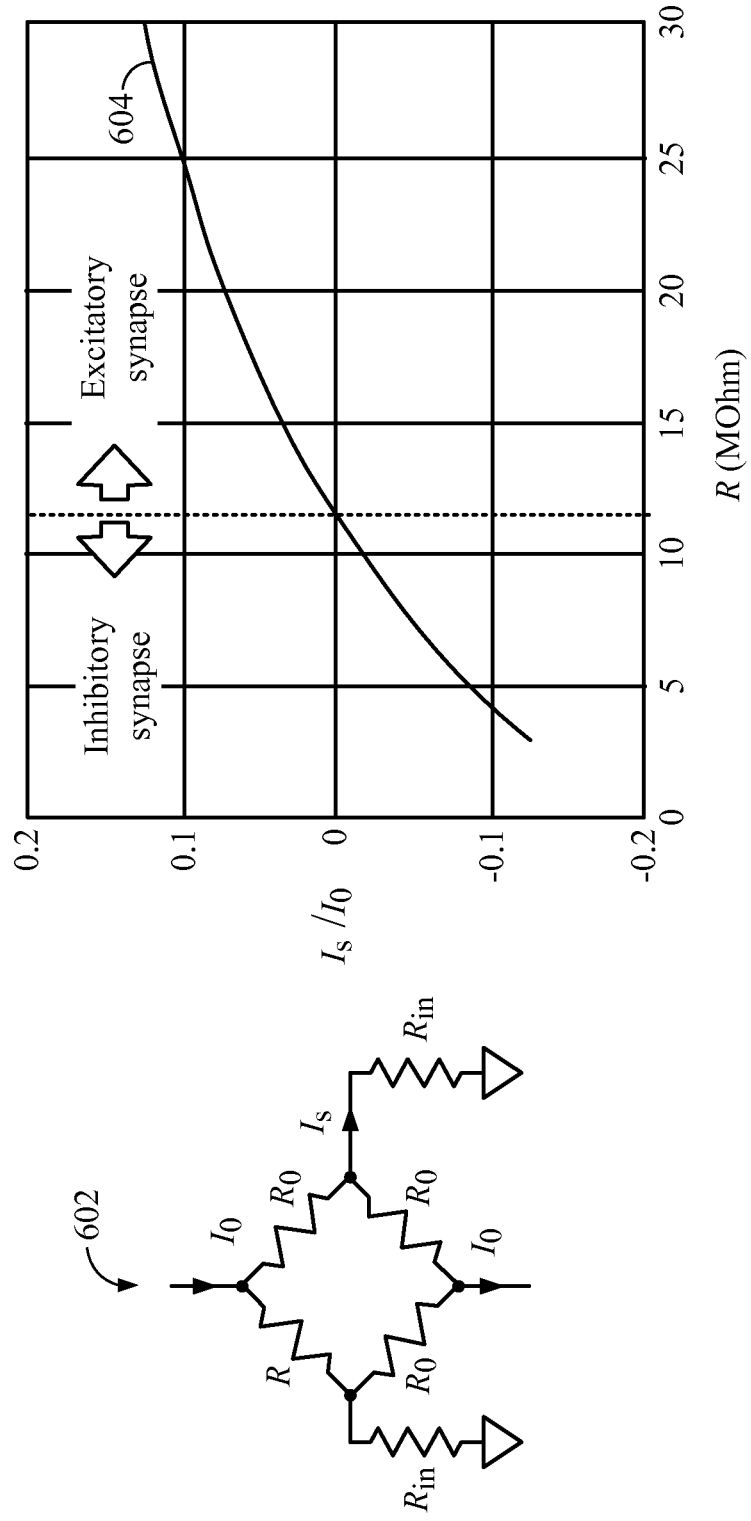
FIG. 6 illustrates an example of the synaptic resistive bridge with one variable resistor in accordance with certain embodiments of the present disclosure.

FIG. 6 illustrates a graph diagram 604 of the synaptic weight w computed as $I_s/I_0$ from equation (6) given as a function of the variable resistance R. It can be observed that varying only one resistor of a resistive bridge 602 (e.g., that may correspond to the resistive bridge 502 from FIG. 5) may lead to a maximum weight magnitude of 0.124 for the selected $R_{in}$=6 MΩ and $R_0$=11.4 MΩ. Making $R_{in}$<<1 MΩ may increase the maximum weight to 0.25 but at the expense of much higher current consumption in the current combiners M1 and M5 from FIG. 5. The preferred approach to compensate for the low $w_{max}$ in the synaptic bridge 502 with one memristor is to increase $I_0$ to yield a desired $I_{s,max}$. For example, if the desired $I_{s,max}$=100 pA per synapse, then $I_0$ may need to be pre-determined to 800 pA.

More efficient approach to increase the maximum weight of the synaptic bridge 502 is to vary more than one resistor in the bridge. For example, if the resistors $R_2$ and $R_4$ are varied together as R, while the resistors $R_1$ and $R_3$ are fixed at the value of $R_0$, then the synaptic current may be given as:

$$I_s = I_0 \frac{R - R_0}{R + R_0 + 4R_{in}}. \quad (9)$$

To vary $I_s$ between symmetrical bounds $-I_{s,max}$ and $+I_{s,max}$ while tuning R between $R_{min}$ and $R_{max}$, the resistance value $R_0$ of the fixed resistors $R_1$ and $R_3$ may be chosen as:

$$R_0 = \sqrt{(R_{min}+2R_{in})(R_{max}+2R_{in})} - 2R_{in}. \quad (10)$$

Then, the corresponding $I_{s,max}$ may be given as:

$$I_{s,max} = I_0 \frac{\sqrt{R_{max} + 2R_{in}} - \sqrt{R_{min} + 2R_{in}}}{\sqrt{R_{max} + 2R_{in}} + \sqrt{R_{min} + 2R_{in}}}. \quad (11)$$

Figure 7:
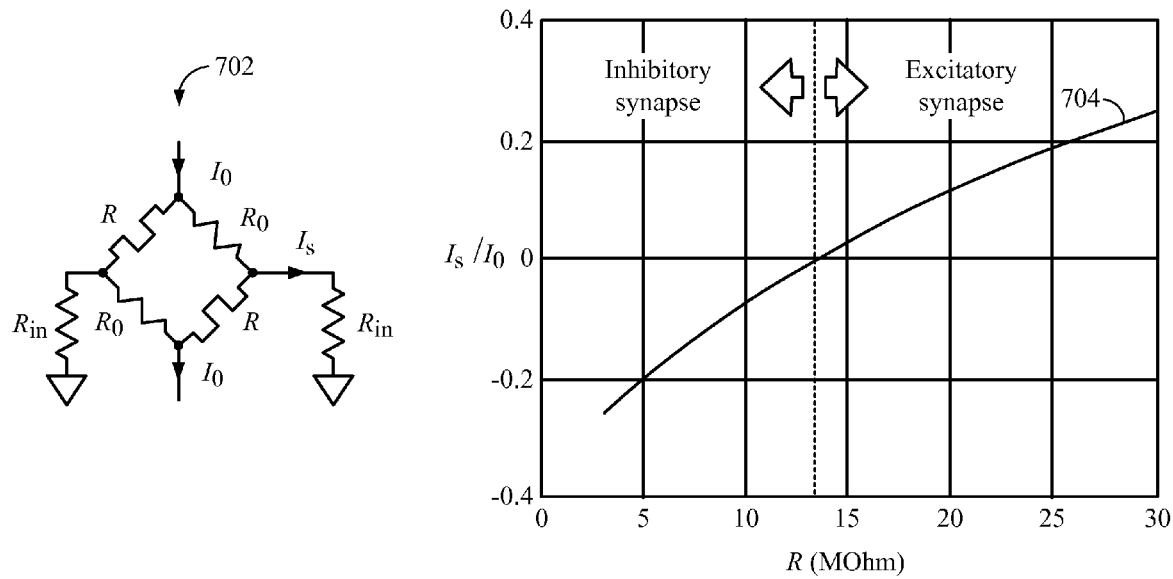
FIG. 7 illustrates an example of the synaptic resistive bridge with two variable resistors in accordance with certain embodiments of the present disclosure.

For example, if $R_{min}$=3 MΩ, $R_{max}$=30 MΩ, and $R_{in}$=6 MΩ, then $R_0 \approx 13.1$ MΩ and $I_{s,max} \approx 0.25 I_0$. FIG. 7 illustrates a graph diagram 704 of the synaptic weight computed as $I_s/I_0$ from equation (9) given as a function of the variable resistance R. A resistive bridge 702 may correspond to the current divider 410 from FIG. 4B or to the resistive bridge 502 from FIG. 5 with two out of four resistors implemented as variable memristors.

Varying all four resistors in the resistive bridge 702 (e.g., varying $R_1$ and $R_3$ in one direction and $R_2$ and $R_4$ in another direction) may provide even higher level of $w_{max}$. However, implementation complexity of this approach may be prohibitively high, and therefore it is out of scope of this disclosure.

Figure 8:
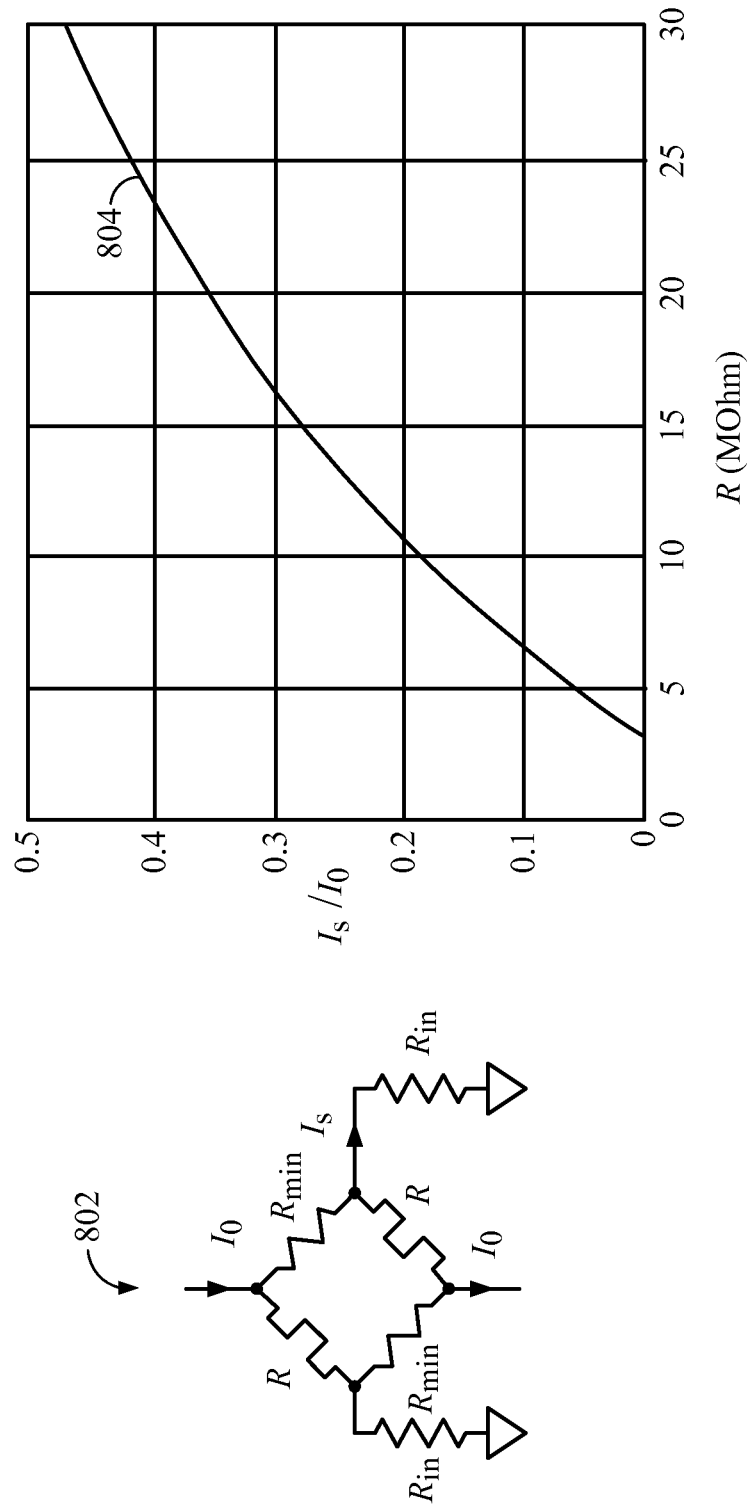
FIG. 8 illustrates an example of the resistive bridge of an excitatory-only synapse in accordance with certain embodiments of the present disclosure.

If the synaptic connection is required to be only of one type (i.e., excitatory or inhibitory), then this may be achieved with a proper selection of the resistance $R_0$. For example, a resistive bridge 802 illustrated in FIG. 8 (e.g., corresponding to the resistive bridge 502 from FIG. 5) may provide an excitatory-only connection by fixing $R_1$ and $R_3$ at $R_{min}$ and varying $R_2$ and $R_4$. It can be observed that the corresponding synaptic weight given by a w(R) tuning curve 804 is always positive, i.e. the synaptic connection based on the resistive bridge 802 may be excitatory-only. Fixing $R_1$ and $R_3$ at $R_{max}$ may make the synaptic connection inhibitory-only, i.e. the w(R) tuning curve may be always negative. To invert the slope of the w(R) tuning curve, $R_1$ and $R_3$ may be varied, while $R_2$ and $R_4$ may be fixed at the value of $R_0$.

The fixed resistors in the synaptic bridge may be implemented in several ways. In one embodiment, either an N-well resistor or a high-R poly resistor may be used. In both cases, a sheet resistance may be approximately 1 kΩ/sq. Therefore, in order to implement a 13.1 MΩ resistance, the total length of 0.5 μm-wide high-R resistor may be 6.55 mm, which is impractical. In another embodiment, a diode connected metal-oxide-semiconductor field-effect transistor (MOSFET) may be used to implement a CMOS resistor. However, at the electrical current densities of less than 1 nA, the smallest diode-connected MOSFET operates in the sub-threshold region with an exponential $I_D(V_{DS})$ function. Therefore, such diode-connected MOSFET may exhibit a very nonlinear resistance.

In the preferred embodiment of the present disclosure, the area-efficient fixed resistors may be implemented by using memristors in their initial state, which may correspond to the resistance of $R_{max}$=30 MΩ. Since the voltage drop across the synaptic bridge during input spikes may not exceed a few mVs, the memristors may retain their stored conductances. To implement $R_0$=13.1 MΩ, a parallel connection of two or three memristors of 30 MΩ may be utilized.

Figure 9:
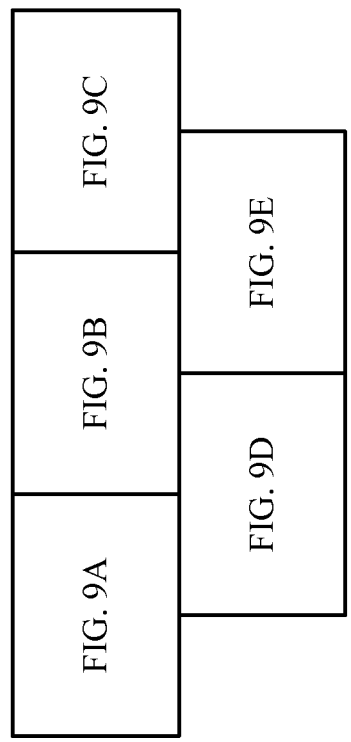
FIGS. 9-9E illustrate an example schematic diagram of a synapse circuit in accordance with certain embodiments of the present disclosure.
Figure 9A:
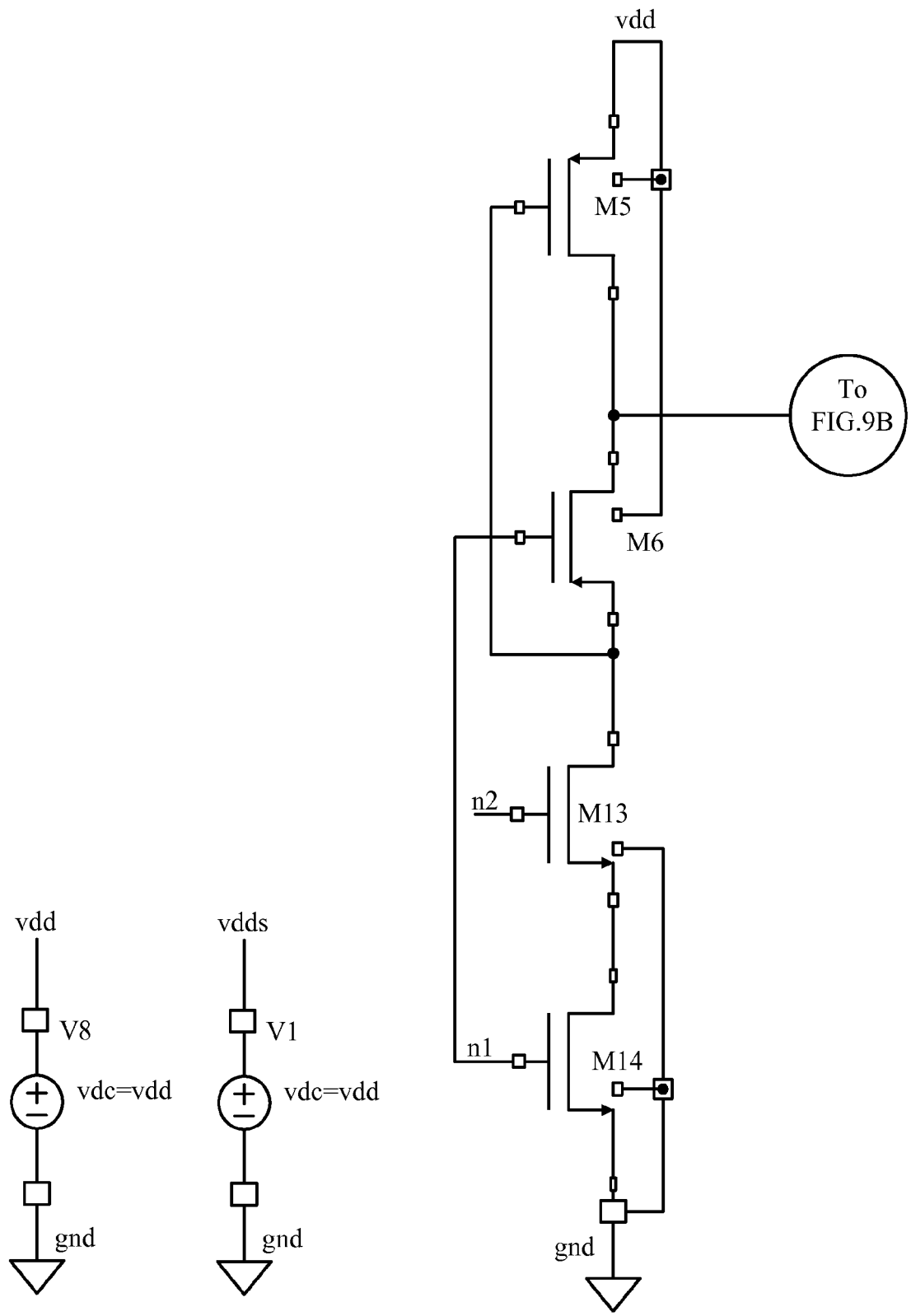
Figure 9B:
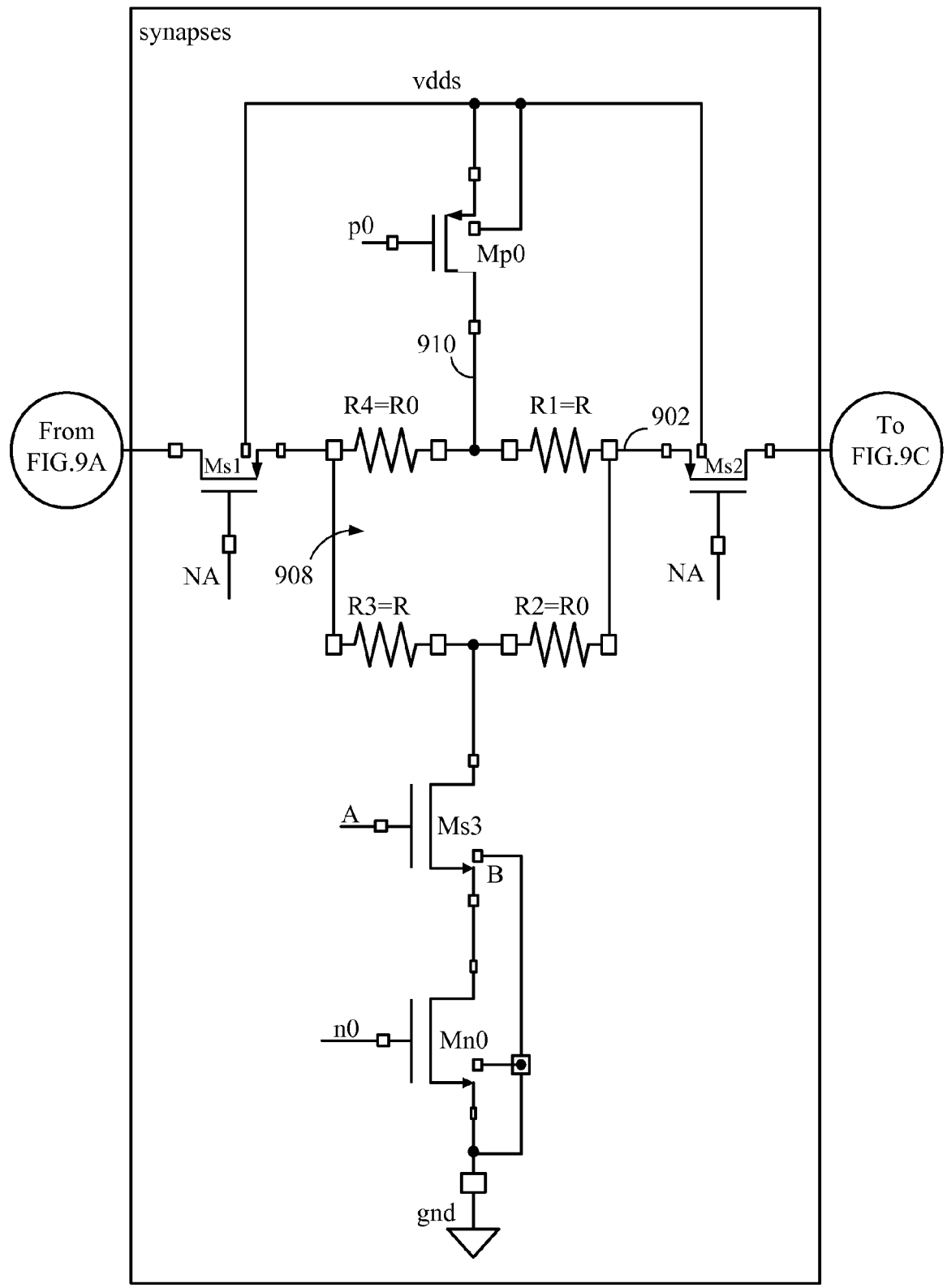
Figure 9C:
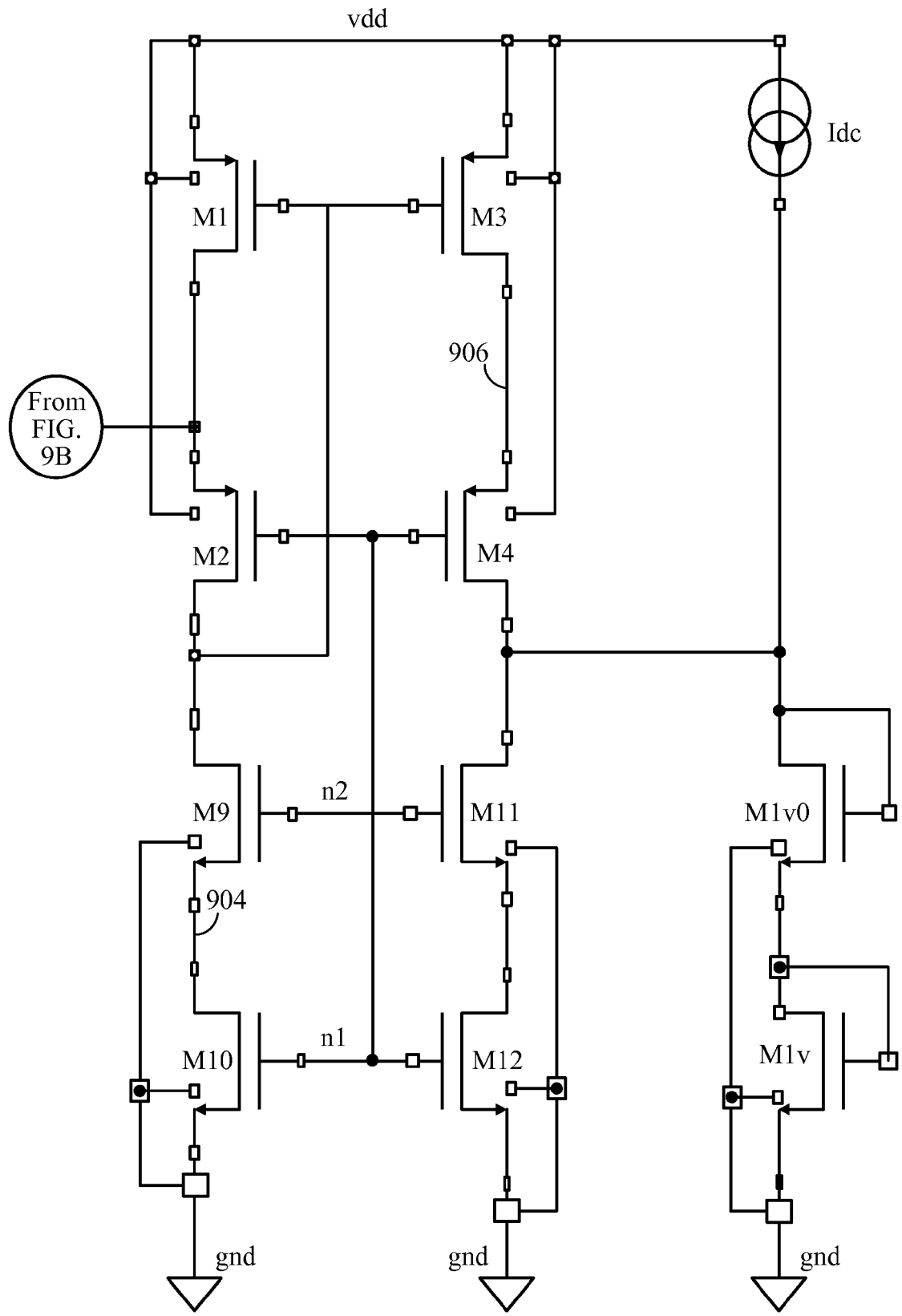
Figure 9D:
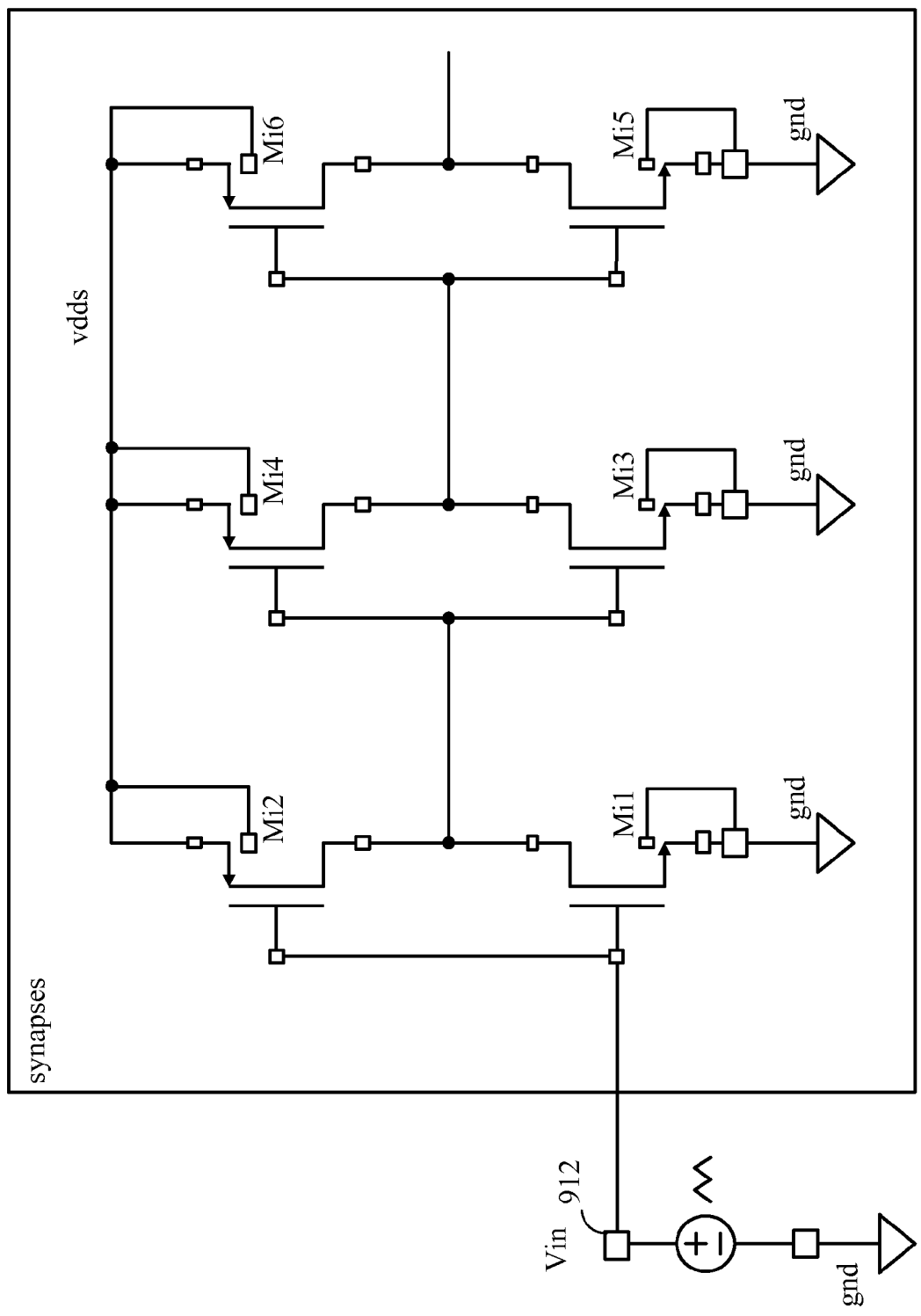
Figure 9E:
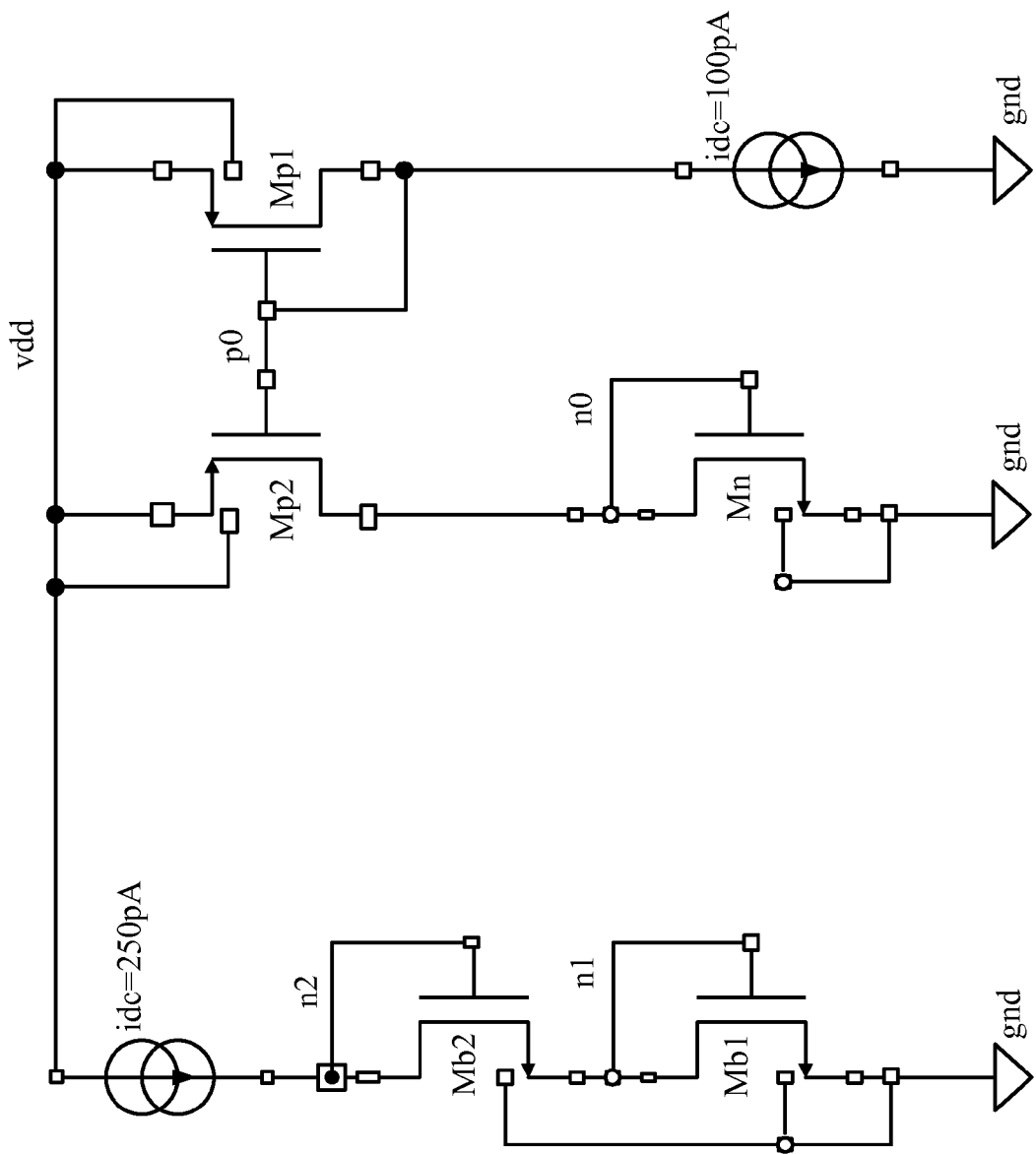

More detailed schematic diagram of the proposed synapse circuit 500 from FIG. 5 is illustrated in FIG. 9. It can be observed several implementation differences between the synapse circuit 900 and the circuit 500. First, the n-channel current combiners M1 and M5 from FIG. 5 may be replaced with p-channel current combiners M1 and M5, respectively, as illustrated in FIG. 9. Second, the positive direction of the synaptic current for the excitatory connection is from the combiner M1 to the combiner M5. Third, a local feedback amplifier 510 from FIG. 5 may be implemented as a cascade M2/M6 and a current sink M9/M13 and M10/M14, as illustrated in FIG. 9.

Fourth, a current mirror M3-M4 from FIG. 9 may supply a synaptic current 902 plus a DC current 904 of a current sink M9-M10. This DC current may be subtracted from a total current 906 of transistors M3-M4, and a remainder (i.e., the synaptic current only) may be fed to a diode-connected MN of a v-circuit of a post-synaptic neuron. Fifth, as illustrated in FIG. 9, two switches Ms1 and Ms2 may be added on both sides of a resistive bridge 908 to disconnect the bridge from the rest of the synapses in the absence of spikes in the corresponding input to prevent bleeding of the spike current from the active synapses. Sixth, besides two current sources Mp0 and Mn0, a supplying current 910, the memristive bridge 908, and switches Ms1-Ms3, each synapse may also include three inverters Mi1-Mi2, Mi3-Mi4, Mi5-Mi6 to generate control signals for the switches. These inverters may be connected to a synapse input 912, as illustrated in FIG. 9.

It should be noted that a power consumption of the synapse circuit 900 may comprise two parts. One part may correspond to a power consumption of the current combiners and the current references of 1.25 nW, shared by all synapses. The other part may correspond to a power consumption of each synapse of 1.18 nW per spike of a duration of 0.8 ms. Most of the synapse current during spiking may be consumed by the inverters Mi1-Mi6. The average power consumption of each synapse over a longer period of time may depend on the spiking activity at the corresponding input. For example, if a synapse receives N 0.8 ms wide spikes during a T [ms] time, then the average power consumption of this synapse may be calculated as $N \cdot 1.18 \cdot 0.8/T$ [nW].

Figure 10:
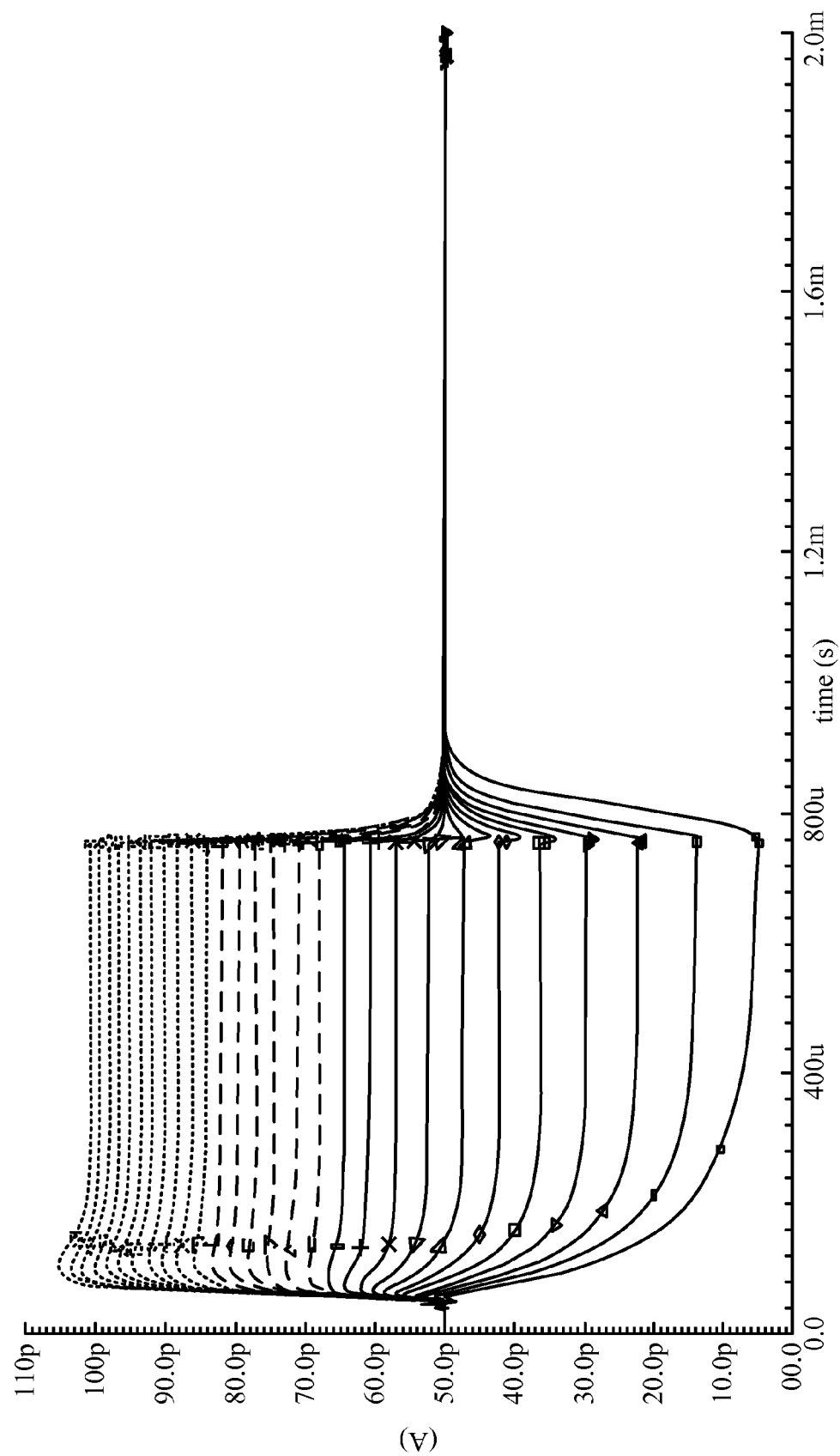
FIG. 10 illustrates an example graph diagram of a synapse current over time as a function of the variable resistance in the synaptic resistive bridge in accordance with certain embodiments of the present disclosure.

FIG. 10 illustrates an input current from one active synapse over time as a function of the $R_1$ and $R_3$ resistances equal to R varied from 3 MΩ to 30 MΩ with 1 MΩ step, while $R_2$ and $R_4$ are fixed at $R_0$=10 MΩ. A combined current from pre-synaptic neurons can be fixed at 50 pA. It can be observed from FIG. 10 that depending on the variable resistance R, the synapse may generate an input current of a post-synaptic neuron between approximately 0 pA and 100 pA, i.e., the combined current from the pre-synaptic neurons may be both decreased and increased by the synapse. The range of the post-synaptic neuron input current may be increased by increasing the value of the input current to the synapse connection.

Figure 11:
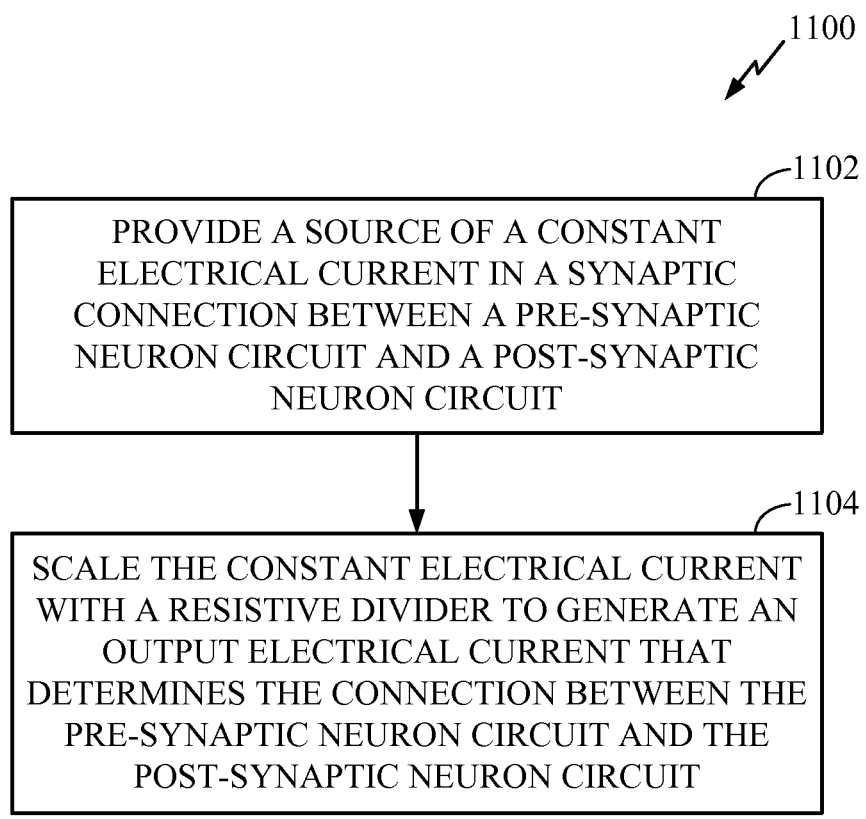
FIG. 11 illustrates example operations for implementing a synapse circuit in accordance with certain embodiments of the present disclosure.

FIG. 11 illustrates example operations 1100 for controlling a synaptic connection between a pre-synaptic neuron circuit and a post-synaptic neuron circuit in accordance with certain embodiments of the present disclosure. At 1102, a source of a constant electrical current may be provided. At 1104, the constant electrical current may be scaled with a resistive divider to generate an output electrical current that determines the connection between the pre-synaptic neuron circuit and the post-synaptic neuron circuit.

Figure 11A:
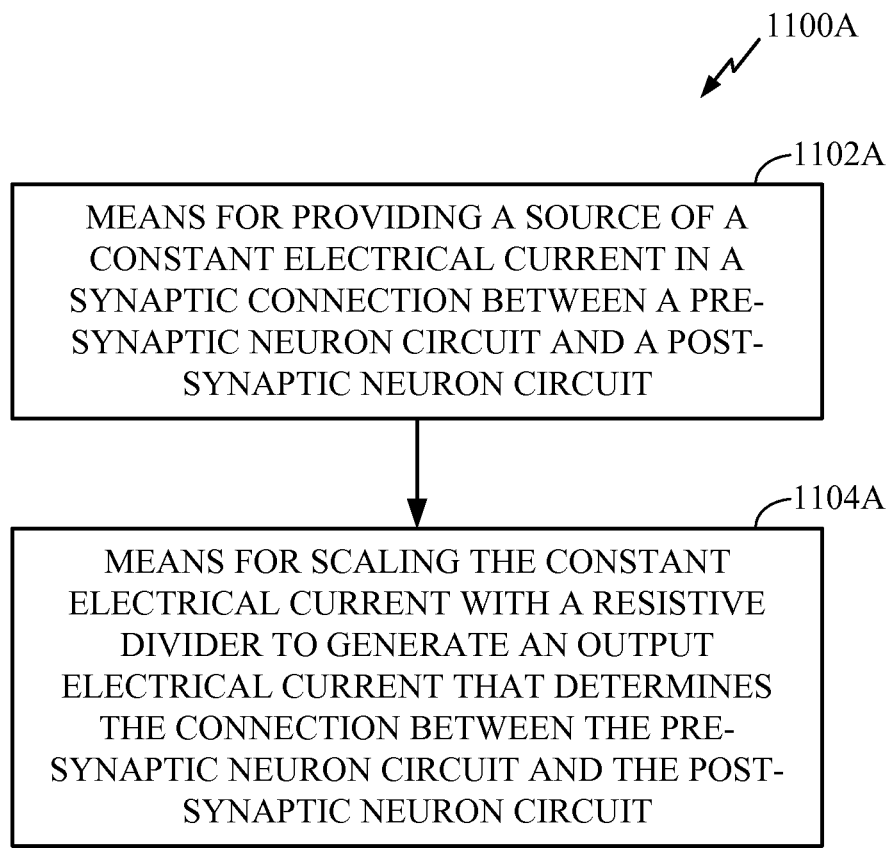
FIG. 11A illustrates example components capable of performing the operations illustrated in FIG. 11.

The various operations of methods described above may be performed by any suitable means capable of performing the corresponding functions. The means may include various hardware and/or software component(s) and/or module(s), including, but not limited to a circuit, an application specific integrate circuit (ASIC), or processor. Generally, where there are operations illustrated in Figures, those operations may have corresponding counterpart means-plus-function components with similar numbering. For example, operations 1100 illustrated in FIG. 11 correspond to components 1100A illustrated in FIG. 11A.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, EPROM memory, EEPROM memory, registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware or any combination thereof. If implemented in software, the functions may be stored as one or more instructions on a computer-readable medium. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk and Blu-ray® disc where disks usually reproduce data magnetically, while discs reproduce data optically with lasers.

Thus, certain embodiments may comprise a computer program product for performing the operations presented herein. For example, such a computer program product may comprise a computer readable medium having instructions stored (and/or encoded) thereon, the instructions being executable by one or more processors to perform the operations described herein. For certain embodiments, the computer program product may include packaging material.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio and microwave, then the coaxial cable, fiber optic cable, twisted pair, DSL, or wireless technologies such as infrared, radio and microwave are included in the definition of transmission medium.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

While the foregoing is directed to embodiments of the present disclosure, other and further embodiments of the disclosure may be devised without departing from the basic scope thereof, and the scope thereof is determined by the claims that follow.

What is claimed is:

1. A synaptic electrical circuit for connection between a pre-synaptic neuron circuit and a post-synaptic neuron circuit, comprising:
    a source of a constant electrical current, and
    a resistive divider comprising two memristors tuned in opposite directions such that as the resistance of a first memristor increases the resistance of a second memristor decreases, and vice versa, and configured to scale the constant electrical current to generate an output electrical current that determines a connection between the pre-synaptic neuron circuit and the post-synaptic neuron circuit.

2. The electrical circuit of claim 1, wherein the resistive divider comprises a resistive bridge.

3. The electrical circuit of claim 2, wherein the resistive bridge comprises at least the two memristors tuned in opposite directions.

4. The electrical circuit of claim 3, wherein a resistance of at least one of the two memristors is variable.

5. The electrical circuit of claim 1, wherein the constant electrical current is scaled such that a spike at an output of the pre-synaptic neuron circuit causes an input electrical current of the post-synaptic neuron circuit to increase by a value determined by the resistive divider.

6. The electrical circuit of claim 1, wherein the constant electrical current is scaled such that a spike at an output of the pre-synaptic neuron circuit causes an input electrical current of the post-synaptic neuron circuit to decrease by a value determined by the resistive divider.

7. The electrical circuit of claim 1, wherein a spike at an output of the pre-synaptic neuron circuit causes the constant electrical current to be input into the resistive divider and to be output from the resistive divider.

8. A method for controlling a synaptic connection between a pre-synaptic neuron circuit and a post-synaptic neuron circuit, comprising:
    providing a source of a constant electrical current; and
    scaling the constant electrical current with a resistive divider comprising two memristors tuned in opposite directions such that as the resistance of a first memristor increases the resistance of a second memristor decreases, and vice versa, and configured to generate an output electrical current that determines the connection between the pre-synaptic neuron circuit and the post-synaptic neuron circuit.

9. The method of claim 8, wherein the resistive divider comprises a resistive bridge.

10. The method of claim 9, wherein the resistive bridge comprises at least the memristors tuned in opposite directions.

11. The method of claim 10, wherein a resistance of at least memristors is variable.

12. The method of claim 8, wherein scaling comprises:
    scaling the constant electrical current such that a spike at an output of the pre-synaptic neuron circuit causes an input electrical current of the post-synaptic neuron circuit to increase by a value determined by the resistive divider.

13. The method of claim 8, wherein scaling comprises:
    scaling the constant electrical current such that a spike at an output of the pre-synaptic neuron circuit causes an input electrical current of the post-synaptic neuron circuit to decrease by a value determined by the resistive divider.

14. The method of claim 8, wherein a spike at an output of the pre-synaptic neuron circuit causes the constant electrical current to be input into the resistive divider and to be output from the resistive divider.

15. An apparatus for controlling a synaptic connection between a pre-synaptic neuron circuit and a post-synaptic neuron circuit, comprising:
    means for providing a source of a constant electrical current; and
    means for scaling the constant electrical current with a resistive divider comprising two memristors tuned in opposite directions such that as the resistance of a first memristor increases the resistance of a second memristor decreases, and vice versa, and configured to generate an output electrical current that determines the connection between the pre-synaptic neuron circuit and the post-synaptic neuron circuit.

16. The apparatus of claim 15, wherein the resistive divider comprises a resistive bridge.

17. The apparatus of claim 16, wherein the resistive bridge comprises at least the two memristors tuned in opposite directions.

18. The apparatus of claim 17, wherein a resistance of at least one of the two memristors is variable.

19. The apparatus of claim 15, wherein the means for scaling comprises:
    means for scaling the constant electrical current such that a spike at an output of the pre-synaptic neuron circuit causes an input electrical current of the post-synaptic neuron circuit to increase by a value determined by the resistive divider.

20. The apparatus of claim 15, wherein the means for scaling comprises:
    means for scaling the constant electrical current such that a spike at an output of the pre-synaptic neuron circuit causes an input electrical current of the post-synaptic neuron circuit to decrease by a value determined by the resistive divider.

21. The apparatus of claim 15, wherein a spike at an output of the pre-synaptic neuron circuit causes the constant electrical current to be input into the resistive divider and to be output from the resistive divider.

* * * * *